United States Patent [19]

Pankove

[11] 4,028,720

[45] June 7, 1977

[54] PHOTOVOLTAIC DEVICE

[75] Inventor: Jacques Isaac Pankove, Princeton, N.J.

[73] Assignee: RCA Corporation, New York, N.Y.

[22] Filed: May 24, 1976

[21] Appl. No.: 689,181

[52] U.S. Cl. .................................. 357/30; 357/63; 357/61; 357/58
[51] Int. Cl.² ........................................ H01L 27/14
[58] Field of Search .................... 357/30, 63, 61, 58

[56] References Cited

UNITED STATES PATENTS

| 3,812,519 | 5/1974 | Nakamura | 317/234 R |
| 3,834,953 | 9/1974 | Nakamura | 148/186 |
| 3,858,238 | 12/1974 | Nakamura | 357/63 |

*Primary Examiner*—Martin H. Edlow
*Attorney, Agent, or Firm*—Glenn H. Bruestle; Daniel N. Calder

[57] ABSTRACT

A body of a photovoltaic device is of silicon having gallium and arsenic paired molecular impurities of a concentration on the order of $10^{18}$ atoms/cm³ or greater.

10 Claims, 2 Drawing Figures

PHOTOVOLTAIC DEVICE

BACKGROUND OF THE INVENTION

The present invention relates to photovoltaic devices and more particularly to photovoltaic devices having semiconductor bodies with increased absorption coefficients.

Photovoltaic devices such as solar cells are capable of converting solar radiation energy into usable electrical energy. This conversion of energy occurs as a result of what is well known in the solar cell field as the "photovoltaic effect." Two processes are involved in the photo voltaic effect. The first process is the generation in the semiconductor material of electrons and holes as a result of the materials absorption of solar radiation. Secondly, the electrons and holes are separated at some built-in electric field in the solar cell device, and it is this separation which results in the generation of an electrical current. A built-in electric field can be generated in a solar cell by, for exmple, a P-N junction.

For the electrons and holes to be useful in current generation it is desirable that they be generated within a diffusion length of the P-N junction. As is well known in the art, the probability of a generated hole or electron crossing a P-N junction is reduced if it is generated beyond a diffusion length. Thus, a semiconductor material, such as silicon, with an improved solar radiation absorption coefficient, would increase the efficiency of a silicon solar cell device, by absorbing more radiation within a diffusion length of the junction.

Also a problem encountered in the field of solar cells is the cost of producing electrical energy on a competitive basis with respect to other means of electrical energy generation. One of the largest expenses involved in solar cell manufacture is the cost of the semiconductor material of the solar cell body, which is typically single crystalline silicon. Silicon has good photovoltaic properties since it can absorb radiation over most of the solar radiation spectrum and has a long carrier lifetime. However, the body of a silicon solar cell is very thick, i.e. about 50 micrometers or more, to ensure sufficient absorption of solar radiation. Naturally, the more semiconductor material needed the higher the cost of a solar cell. Therefore, another desirable effect of improving the absorption coefficient of a semiconductor material, such as silicon, would be to reduce the thickness of the silicon bodies in photovoltaic devices.

SUMMARY OF THE INVENTION

A photovoltaic device includes a body of silicon having gallium and arsenic molecular impurity pairs in a concentration of $10^{18}$ impurity pairs per cubic centimeter or greater. The body has an incident surface on which solar radiation is capable of impinging. The body has a built-in electric field.

DETAILED DESCRIPTION OF THE INVENTION

Figure 1:
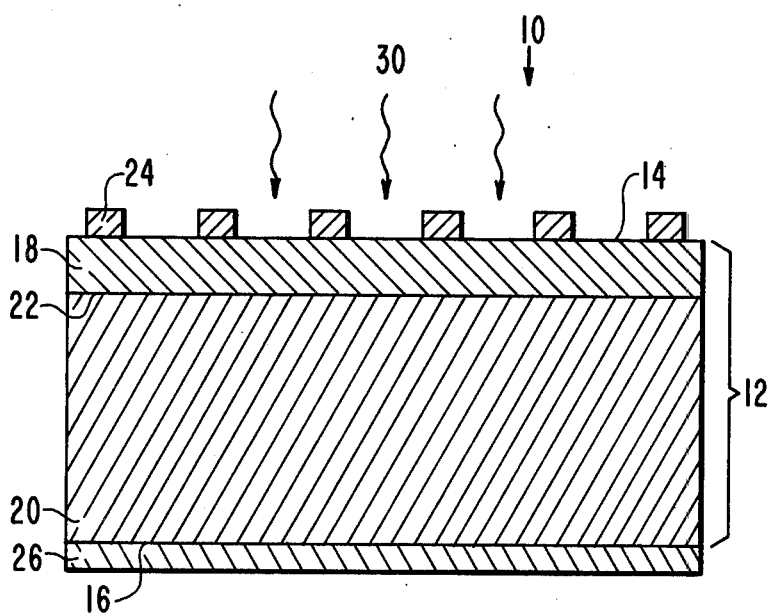
FIG. 1 is a cross-sectional view of the photovoltaic device of the present invention.

Referring to FIG. 1, a semiconductor photovoltaic device of the present invention is designated as 10. For the purpose of explaining the semiconductor photovoltaic device 10 of the present invention, it will be described as a P-N junction solar cell.

The solar cell 10 includes a body 12 of silicon having gallium and arsenic paired as molecular impurities. The body 12 has an incident surface 14 on which solar radiation is capable of impinging and a surface 16 opposite the incident surface 14. Along the incident surface 14 in the body 12 is a first layer 18 of one conductivity type. Contiguous to the first layer 18 and along the opposite surface 16 is a second layer 20. The second layer 20 is of a conductivity opposite that of the first layer 18, thus there is a P-N junction 22 therebetween. The first and second layers 18 and 20 can be of either N or P conductivity type as long as the layers are of opposite conductivities, however, for the purpose of describing the present invention, the first layer 18 is of P type conductivity and the second layer 20 is of N type conductivity. Typically, the conductivity inducing dopant concentration, i.e. the acceptor and donor dopant concentration, of the first and second layers 18 and 20 respectively, are graded so that the highest concentration is at the incident surface 14 and opposite surface 16. Having a high concentration at the surfaces 14 and 16 reduced the internal resistance of the cell 10 and makes electrical contacting of these surfaces easier. The conductivity producing impurities may be atoms other than the gallium and arsenic. Since the gallium and arsenic molecular pairs are electrically neutral, the P-type conductivity may be enhanced by increasing the gallium concentration and the N type conductivity may be provided by increasing the arsenic concentration, i.e. the material may be made N or P type by deviation from the stoicheiometry of the pair.

On a portion of the incident surface 14 is a grid electrode 24. The grid electrode 24 can have any pattern shape well known to those in the art such as a mesh pattern or finger pattern. The grid electrode 24 preferably covers only about 5% or less of the area of the incident suface 14. It is desirable that the grid electrode 24 cover as little of the surface area 14 as possible, since the grid electrode 24 shadows the solar radiation impinging on the incident surface 14. However, the presence of the grid electrode 24 is desirable to reduce the internal resistance of the cell 10. On the opposite surface 16 is an electrode 26. Both grid electrode 24 and electrode 26 form ohmic contacts with the semiconductor body 12. Also, the grid electrode 24 and electrode 26 can be a single layer of a metal, such as aluminum, or the electrodes 24 and 26 can be multilayered, for example, a first layer directly on the body 12 of chromium with a second layer of a metal, such as gold, on the chromium layer.

In the operation of the solar cell 10, solar radiation 30 impinges the body 12 at the incident surface 14. As is well known in the art, solar radiation, if absorbed by a semiconductor body, generates electron-hole pairs. With the first layer 18 of P type conductivity, the electrons generated within the first layer 18 are minority carriers, while hole carriers generated in the N type conductivity second layer 20 are minority carriers in the second layer 20. Some of the minority carriers will diffuse toward the built-in electric field of P-N junction 22. The minority carriers crossing the P-N junction 22 generate a flow of electrical current.

It is well known in the solar cell art that the amount of solar radiation which a semiconductor material will absorb is a function of the absorbance of the semiconductor material. The absorption coefficient, $\alpha(\lambda)$, of a semiconductor material determines the attenuation per unit path length of incident solar radiation of wavelength $\lambda$. The solar radiant energy absorbed by the material is converted into electron-hole pairs in the semiconductor body. Thus, the higher the absorption coefficient of a semiconductor body, the higher will be the amount of solar radiation absorbed by the body within a given distance from incident surface 14 and consequently the higher the concentration of generated electron-hole pairs within a diffusion length of P-N junction 22.

Figure 2:
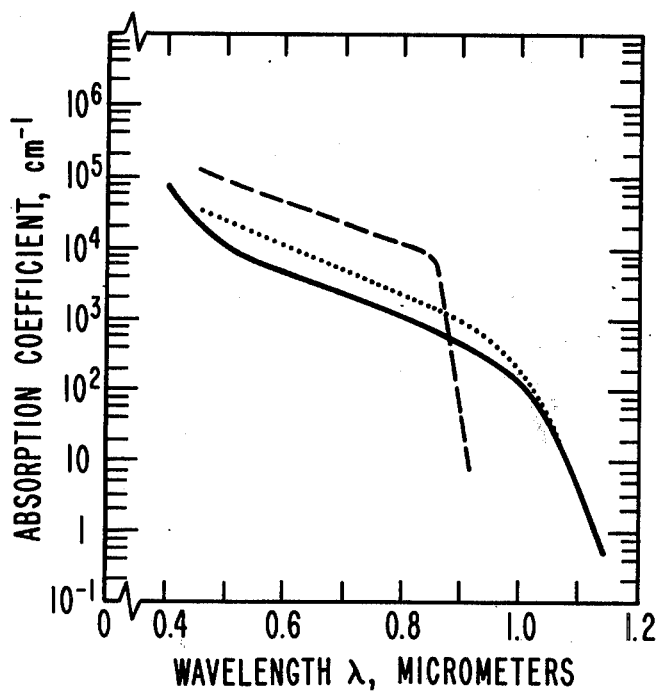
FIG. 2 is a graph of absorption coefficient versus wavelength for silicon, gallium arsenide and silicon having gallium and arsenic paired molecular impurities.

In FIG. 2, there is shown, as a solid line, the absorption coefficient of silicon as a function of the wavelength of solar radiation in the range of 0.4 micrometer to 1.1 micrometer. Also in FIG. 2, there is shown, as a dashed line, the absorption coefficient of gallium arsenide. Gallium arsenide has a higher absorption coefficiency then silicon for most of the visible solar spectrum range, i.e. 0.4 micrometer to about 0.9 micrometer. The higher absorption coefficient of gallium arsenide over the visible range is very desirable. However, an undesirable feature of gallium arsenide is that it has a much shorter carrier lifetime than silicon. The difference in carrier lifetimes of the two materials results from their different band structure, i.e. direct bandgap material versus indirect bandgap material. Carrier recombination occurs more rapidly in a direct bandgap material, such as gallium arsenide, than in an indirect bandgap material, such as silicon. It has been discovered that if silicon is doped with gallium and arsenic molecular impurity pairs in a concentration of an order of $10^{18}$ impurity pairs per cubic centimeter or greater, the resulting semiconductor material has an absorption coefficient higher than silicon over a wavelength of approximately 0.5 micrometer to about 1.0 micrometers, and an absorption coefficient higher than gallium arsenide in the range of about 0.9 to 1.0 micrometer, shown as a dotted line in FIG. 2. In addition, this silicon doped with gallium and arsenic paired molecular impurities has a carrier lifetime much longer than gallium arsenide and approximately equal to that of single crystalline silicon. Therefore, a body of silicon doped with gallium and arsenic molecular impurity pairs such as body 12, can absorb within a shorter distance from the incident surface 14, solar radiation in an amount comparable to that of a body of silicon, with conventional atomic doping. If all the electron-hole pairs are generated within a diffusion length of the P-N junction 22, they will all contribute to the photovoltaic current of cell 10, thus improving the efficiency of cell 10. As a further consequence of the increased absorption coefficient, the body 12 can be relatively thin, i.e. of an order of about two absorption lengths in thickness.

While a noticable increase in absorption concentration occurs with a concentration of about $10^{18}$ atoms/cm$^3$, the absorption coefficient of the material will increase with an increase in the gallium and arsenic molecular pair concentration to a maximum concentration on the order of $1.8 \times 10^{22}$ atoms/cm$^3$. At concentrations above $1.8 \times 10^{22}$ atoms/cm$^3$ the material is essentially a direct bandgap material with shorter carrier lifetime. The concentration of the gallium and arsenic impurity pairs in the silicon material shown as the dotted line in FIG. 2 is on the order of $10^{20}$ atoms/cm$^3$.

In the fabrication of the solar cell 10, the body 12 is formed by chemical vapor deposition techniques well known in the art wherein gallium and arsenic, as impurities, are co-deposited together with silicon on a wafer of single crystalline silicon. The wafer is then removed by state of the art etching or grinding techniques leaving the body 12.

As an alternative method of fabrication, arsenic is deposited on a surface of a silicon wafer and is then diffused into the wafer at about 1250° C. After diffusing in the arsenic, gallium is likewise deposited and diffused into the wafer. The solubility of the gallium is enhanced by the presence of a high concentration of arsenic.

As another alternative method of fabrication, the gallium and arsenic impurities are introduced into a silicon wafer by well known ion implantation techniques. A subsequent annealing treatment of the wafer heals the damage due to implantation and promotes the migration of gallium and arsenic to adjacent lattice sites where their pairing forms the molecular dopant.

No matter which method is used, since arsenic is the dominant impurity, the doped silicon wafer will be of N type conductivity. Therefore, an acceptor impurity, such as boron, is deposited on a surface of the body and then by diffusion techniques well known in the art, the boron is diffused into the body forming the first layer 18. Typically, the acceptor impurity is diffused into the body so that the impurity concentration is graded, with the highest impurity concentration in the vicinity of the deposition surface, on the order of about $10^{20}$ atoms/cm$^3$. That portion of the body which is still of N type conductivity is second layer 20. To grade the impurity concentration of the second layer 20, a donor impurity, such as phosphorous, is deposited on the opposite surface of the body by well known coating techniques and by well known diffusion techniques the phosphorous is diffused into the body so that the highest donor impurity concentration is in the vicinity of the opposite surface, on the order of about $10^{20}$ atoms/cm$^3$. The fabrication of body 12 is now completed.

Next, the body 12 is placed in an evaporation furnace and by well known evaporation techniques, a metal layer is deposited on the opposite surface 16 thereby forming the electrode 26. Also using evaporation techniques a metal layer is deposited on the incident surface 14. Then by photolithographic techniques well known in the art, the pattern of the grid electrode 24 is defined and by etching techniques the unwanted portions of the metal layer are removed thereby forming the grid electrode 24.

The photovoltaic device 10 of the present invention has been described as a P-N junction solar cell, but it is anticipated that silicon having gallium and arsenic paired molecular impurities can be utilized in other well known photovoltaic devices, e.g. PIN and Schottky barrier type devices. These other photovoltaic structures also have a built-in electric field, the presence of which is actually the basis of the energy conversion process in photovoltaic devices.

The photovoltaic device of the present invention includes a body of silicon which has gallium and arsenic paired molecular impurities which enhance the absorption coefficient, over most of the visible spectrum, higher than that of atomically doped single crystalline silicon, and thereby can be more efficient in converting solar energy and can be of a thickness much less than that of a body of atomically doped silicon.

I claim:

1. A semiconductor photovoltaic device comprising: a body of silicon having therein gallium and arsenic paired molecular impurities in a concentration on the order of $10^{18}$ impurity pairs per cubic centimeter or greater, said body having an incident surface on which solar radiation is capable of impinging, and said body having means for forming a built-in electric field.

2. The semiconductor photovoltaic device in accordance with claim 1 wherein the concentration of the gallium and arsenic impurity pairs is in the range of $10^{18}$ to $1.8 \times 10^{22}$ atoms/cm$^3$.

3. The semiconductor photovoltaic device in accordance with claim 2 wherein said means for forming a built-in electric field is a P-N junction.

4. A semiconductor photovoltaic device comprising a body having an incident surface on which solar radiation is capable of impinging, and a surface opposite the incident surface, said body being of silicon having therein gallium and arsenic impurity pairs in a concentration on the order of $10^{18}$ impurity pairs per cubic centimeter or greater, said body having a first layer of one conductivity type along said incident surface and a second layer contiguous to said first layer and along said opposite surface, said second layer being of a conductivity type opposite that of said first layer, with a P-N junction between said first and second layers.

5. The semiconductor photovoltaic device in accordance with claim 4 wherein the conductivity inducing dopant concentration of said first and second layers is graded so that the highest dopant concentration is in the vicinity of the incident surface of the first layer and in the vicinity of the opposite surface of the second layer.

6. The semiconductor photovoltaic device in accordance with claim 5 wherein the highest dopant concentration for each of said first and second layers is on the order of $10^{20}$ atoms/cm$^3$.

7. The photovoltaic device in accordance with claim 6 further including a grid electrode on said incident surface, wherein said grid electrode is on 5% or less of the area of said incident surface.

8. The photovoltaic device in accordance with claim 7 further comprising an electrode on said opposite surface.

9. The photovoltaic device in accordance with claim 8 wherein said first layer is of P type conductivity and said second layer is of N type conductivity.

10. The photovoltaic device in accordance with claim 8 wherein said first layer is of N type conductivity and said second layer is of P type conductivity.

* * * * *